(12) United States Patent
Wu

(10) Patent No.: US 11,957,021 B2
(45) Date of Patent: Apr. 9, 2024

(54) DISPLAY DEVICE AND MANUFACTURING METHOD THEREOF

(71) Applicant: Shenzhen China Star Optoelectronics Semiconductor Display Technology Co., Ltd., Shenzhen (CN)

(72) Inventor: Yongwei Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/053,763

(22) PCT Filed: Sep. 23, 2020

(86) PCT No.: PCT/CN2020/117002
§ 371 (c)(1),
(2) Date: Nov. 7, 2020

(87) PCT Pub. No.: WO2022/047852
PCT Pub. Date: Mar. 10, 2022

(65) Prior Publication Data
US 2023/0189609 A1      Jun. 15, 2023

(30) Foreign Application Priority Data

Sep. 2, 2020    (CN) .......................... 202010911135.9

(51) Int. Cl.
*H10K 59/38*      (2023.01)
*H10K 59/80*      (2023.01)

(52) U.S. Cl.
CPC .......... *H10K 59/38* (2023.02); *H10K 59/877* (2023.02)

(58) Field of Classification Search
CPC ...... H10K 59/38; H10K 59/877; H10K 59/12; H10K 50/854; H10K 59/1201; H10K 71/00
See application file for complete search history.

(56) References Cited

U.S. PATENT DOCUMENTS

2007/0200492 A1    8/2007  Cok et al.
2014/0353626 A1    12/2014 Shim et al.
(Continued)

FOREIGN PATENT DOCUMENTS

CN    108604428 A    9/2018
CN    111016478 A    4/2020
(Continued)

*Primary Examiner* — Zheng Song
*Assistant Examiner* — Glenn D. Zimmerman
(74) *Attorney, Agent, or Firm* — Nathan & Associates; Menachem Nathan

(57) ABSTRACT

The present invention discloses a display device and a manufacturing method thereof having a light emission backplate, color conversion layer and a color film layer. The color conversion layer includes a red light conversion unit, a green light conversion unit, and an opening unit. The red light conversion unit and/or green light conversion unit includes calcium titanate light emitting material and scattering particles stacked in the calcium titanate light emitting material. In a vertical direction pointing from a surface of the color conversion layer near the light emission backplate to a surface away from the light emission backplate, a refractive index of the scattering particles gradually increases.

20 Claims, 5 Drawing Sheets

(56) References Cited

U.S. PATENT DOCUMENTS

| | | | | |
|---|---|---|---|---|
| 2016/0341877 | A1* | 11/2016 | Kim | G02B 6/0088 |
| 2018/0122993 | A1* | 5/2018 | Camras | H01L 33/00 |
| 2019/0203113 | A1* | 7/2019 | Lin | C09K 11/06 |
| 2021/0009826 | A1* | 1/2021 | Kizaki | C09D 11/101 |
| 2021/0261860 | A1* | 8/2021 | Boehm | C09K 11/665 |
| 2022/0278174 | A1* | 9/2022 | Yu | G02F 1/133617 |

FOREIGN PATENT DOCUMENTS

| | | | | |
|---|---|---|---|---|
| CN | 111240095 A | | 6/2020 | |
| CN | 111403446 A | | 7/2020 | |
| WO | WO-2013154133 A1 | * | 10/2013 | F21V 13/02 |
| WO | WO-2020042650 A1 | * | 3/2020 | H01L 27/322 |

* cited by examiner

| Forming a light emission backplate | ~ S1 |

| Forming a color conversion layer on the light emission backplate, wherein the color conversion layer is disposed on the light emission backplate, the color conversion layer comprises a red light conversion unit, a green light conversion unit, and an opening unit, the red light conversion unit and/or the green light conversion unit comprises calcium titanate light emitting material and scattering particles stacked and disposed in the calcium titanate light emitting material, a refractive index of the scattering particles gradually increases along a vertical direction pointing from a surface of the color conversion layer near the light emission backplate to a surface of the color conversion layer away from the light emission backplate | ~ S2 |

| Forming a color film layer on the color conversion layer, wherein the color film layer is disposed on the color conversion layer, the color film layer comprises a red color resist block, a blue color resist block, and a green color resist block arranged at intervals, wherein the red color resist block, the green color resist block, and the blue color resist block are disposed correspondingly on the red light conversion unit respectively, the green light conversion unit, and the opening unit respectively | ~ S3 |

FIG. 4

DISPLAY DEVICE AND MANUFACTURING METHOD THEREOF

FIELD OF INVENTION

The present invention relates to a field of display technologies, especially relates to a display device and a manufacturing method thereof.

BACKGROUND OF INVENTION

Organic light emitting diode (OLED) display devices, also called organic electroluminescence display devices, because of advantages such as simple manufacturing processes, low costs, low power consumptions, high light emission brightness, extensive ranges of work temperature, light weights, fast responses, and easy achievement for color display and large size display, easily match the integrated circuit driver and easily achieve flexible display to have broad application prospects. A perovskite organic light emitting diode (Pe-OLED, calcium titanate organic light emitting diode) is a new self-light-emitting diode. Compared to the OLED, the Pe-OLED has advantages of high color purity, and low material costs. Compared to a quantum dot organic light emitting diode (QD-OLED) light emitting device, a development cost of the calcium titanate light emitting material is lower than that of the quantum dot material, and the calcium titanate light emitting material requires no complex composition and modification processes. Therefore, the Pe-OLED display device is a high-end display device has great application prospects.

However, using the calcium titanate light emitting material as a color conversion layer has disadvantageous factors of a light absorption rate and a light extraction rate and results in a low light conversion efficiency of the color conversion layer. The low light conversion efficiency directly affects energy use efficiency and brightness of the display device, which disadvantages the advanced development of the display device.

Therefore, it is necessary to set forth a new technical solution to solve the above technical issue.

SUMMARY OF INVENTION

Technical Issue

The present invention embodiment provides a display device and a display device manufacturing method configured to mitigate the isse of a low light conversion efficiency of a color conversion layer in a display device.

Technical Solution

The present invention provides a display device, comprising:
    a light emission backplate;
    a color conversion layer disposed on the light emission backplate, the color conversion layer comprising a red light conversion unit, a green light conversion unit, and an opening unit, wherein the red light conversion unit and/or the green light conversion unit comprises calcium titanate light emitting material and scattering particles stacked and disposed in the calcium titanate light emitting material, a refractive index of the scattering particles gradually increases along a vertical direction pointing from a surface of the color conversion layer near the light emission backplate to a surface of the color conversion layer away from the light emission backplate; and
    a color film layer disposed on the color conversion layer, and the color film layer comprising a red color resist block, a blue color resist block, and a green color resist block arranged at intervals, wherein the red color resist block, the green color resist block, and the blue color resist block are disposed correspondingly on the red light conversion unit respectively, the green light conversion unit, and the opening unit respectively.

In the display device provided by the present invention, the scattering particles at least comprise first scattering particles and second scattering particles, and a refractive index of the first scattering particles is less than a refractive index of the second scattering particles, wherein the first scattering particles are disposed on a surface of the red light conversion unit and/or the green light conversion unit near the light emission backplate, and the second scattering particles are disposed on a surface of the red light conversion unit and/or the green light conversion unit away from the light emission backplate.

In the display device provided by the present invention, a ratio of the refractive index of the second scattering particles and the refractive index of the first scattering particles is from greater than 1 to 2.

In the display device provided by the present invention, a cross-sectional width of each of the first scattering particles is greater than a cross-sectional width of each of the second scattering particles.

In the display device provided by the present invention, the second scattering particles are disposed at least partially on the first scattering particles; or, the second scattering particles are staggered from the first scattering particles.

In the display device provided by the present invention, the first scattering particles comprise inorganic scattering particles and organic scattering particles, the second scattering particles comprise inorganic scattering particles and organic scattering particles.

In the display device provided by the present invention, the inorganic scattering particles comprise at least one of titanium dioxide, zirconium dioxide, vanadium dioxide, tin dioxide, aluminum oxide, or barium titanate, the organic scattering particles comprise at least one of silastic, polystyrene, or polycarbonate.

In the display device provided by the present invention, a cross-sectional width of each of the inorganic scattering particles and a cross-sectional width of each of the organic scattering particles are from 10 nanometers to 1200 nanometers, and the cross-sectional width of each of the inorganic scattering particles is less than the cross-sectional width of each of the organic scattering particles.

In the display device provided by the present invention, the scattering particles further comprise third scattering particles, the third scattering particles are disposed on the surface of the red light conversion unit and/or the green light conversion unit away from the light emission backplate, and a refractive index of the third scattering particles is greater than the refractive index of the second scattering particles.

In the display device provided by the present invention, a ratio of the refractive index of the third scattering particles to the refractive index of the second scattering particles is from greater than 1 to 2.

In the display device provided by the present invention, the third scattering particles comprise inorganic scattering particles.

In the display device provided by the present invention, a cross-sectional width of each of the third scattering particles is less than a cross-sectional width of each of the second scattering particles.

In the display device provided by the present invention, the red light conversion unit and the green light conversion unit are formed by coatings of mixing the calcium titanate light emitting material with the scattering particles of different refractive indexes respectively.

In the display device provided by the present invention, the calcium titanate light emitting material comprises calcium titanate light emitting material with an emission wavelength of red light and calcium titanate light emitting material with an emission wavelength of green light.

In the display device provided by the present invention, the calcium titanate light emitting material comprise inorganic calcium titanate light emitting material and inorganic-organic hybridization calcium titanate light emitting material.

In the display device provided by the present invention, the inorganic calcium titanate light emitting material comprises $CsPbI_3$, the organic-inorganic hybridization calcium titanate light emitting material comprises calcium titanate light emitting material with a chemical formula of $CsPbCl_yBrzI_{3-y-z}$, wherein $0<y<1$, $1 \leq z \leq 3-y$, and/or and comprises calcium titanate light emitting material with a chemical formula of $CsPbBr_xI_{3-x}$, wherein $2 \leq x \leq 3$.

In the display device provided by the present invention, the calcium titanate light emitting material comprises three-dimensional calcium titanate light emitting material and calcium titanate quantum dot material.

The present invention further provides a display device manufacturing method, comprising steps as follows:
a step A: forming a light emission backplate;
a step B: forming a color conversion layer on the light emission backplate, wherein the color conversion layer is disposed on the light emission backplate, the color conversion layer comprises a red light conversion unit, a green light conversion unit, and an opening unit, the red light conversion unit and/or the green light conversion unit comprises calcium titanate light emitting material and scattering particles stacked and disposed in the calcium titanate light emitting material, a refractive index of the scattering particles gradually increases along a vertical direction pointing from a surface of the color conversion layer near the light emission backplate to a surface of the color conversion layer away from the light emission backplate; and
a step C: forming a color film layer on the color conversion layer, wherein the color film layer is disposed on the color conversion layer, the color film layer comprises a red color resist block, a blue color resist block, and a green color resist block arranged at intervals, wherein the red color resist block, the green color resist block, and the blue color resist block are disposed correspondingly on the red light conversion unit respectively, the green light conversion unit, and the opening unit respectively.

In the display device manufacturing method provided by the present invention, the scattering particles at least comprise first scattering particles and second scattering particles, and a refractive index of the first scattering particles is less than a refractive index of the second scattering particles, the step B comprises:
mixing the first scattering particles and second scattering particles with the calcium titanate light emitting material respectively;
coating a first mixture including the first scattering particles and the calcium titanate light emitting material on the light emission backplate; and
coating a second mixture including the second scattering particles and the calcium titanate light emitting material on the first mixture to form the red light conversion unit and/or the green light conversion unit.

In the display device manufacturing method provided by the present invention, the scattering particles further comprise third scattering particles, after the step of coating the second mixture including the second scattering particles and the calcium titanate light emitting material on the first mixture, the method further comprises:
coating a third mixture including the third scattering particles and the calcium titanate light emitting material on the second mixture.

Advantages

In the display device and the display device manufacturing method provided by embodiment of the present invention, employs the calcium titanate light emitting material as the material of the color conversion layer, and disposes scattering particles with the low refractive index on the surface of the red light conversion unit and/or green light conversion unit near the light emission backplate such that the surface of the red light conversion unit and/or green light conversion unit near the light emission backplate converges, enhances, and drives light emitted from the light emission backplate to radiate forward. The first scattering particles improves excitation to the calcium titanate light emitting material. Disposing the scattering particles with the high refractive index on the surface of the red light conversion unit and/or green light conversion unit away from the light emission backplate, improves a light emission efficiency of the surface of the red light conversion unit and/or green light conversion unit away from the light emission backplate, which mitigates low light conversion efficiency of the color conversion layer of the display device.

DESCRIPTION OF DRAWINGS

FIG. 4 is a flow chart of steps of the display device provided by the embodiment of an manufacturing method of the present invention.

DETAILED DESCRIPTION OF PREFERRED EMBODIMENTS

Figure 1:
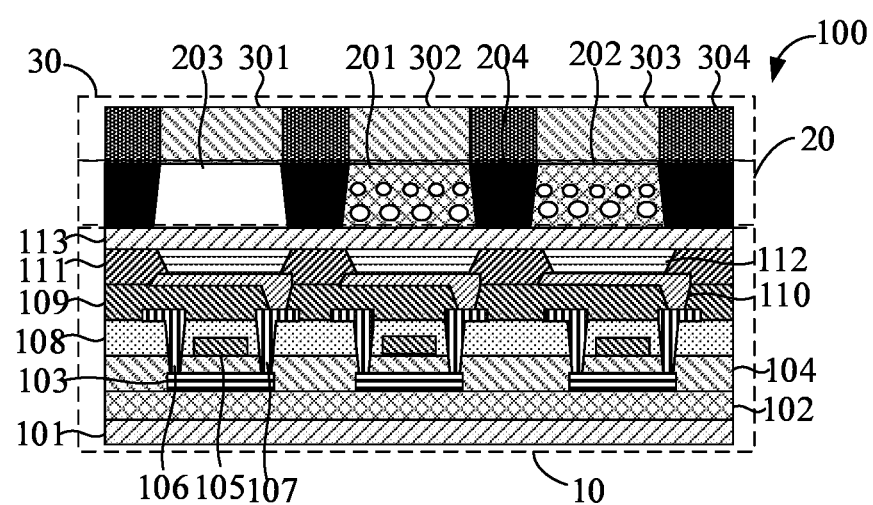
FIG. 1 is a structural schematic view of a display device provided by an embodiment of the present invention.

To make the purpose, technical solutions and advantages of the present invention clearer, the present invention will be further described in detail below in conjunction with the accompanying drawings. Please refer to the drawings in the accompanying drawings, where the same reference characters represent the same elements. The following description is based on the specific embodiments shown in the present invention, which should not be regarded as limiting the present invention other specific embodiment not detailed here. The word "embodiment" used in this specification means an example, exemplary instance or illustration.

In the description of the present invention, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present invention and simplifying the description instead of indicating or implying that the referred device or element must have a specific orientation or position, must to be structured and operated with the specific orientation or position. Therefore, they should not be understood as limitations to the present invention. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present invention, a meaning of "a plurality of" is two or more, unless there is a clear and specific limitation otherwise.

In the description of the present invention, it should be noted that unless clear rules and limitations otherwise exist, terminologies "install", "connect", "connection" should be understood in a broad sense. For instance, the connection can be a fixed connection, a detachable connection or an integral connection. The connection can be a mechanical connection, an electrical connection or a telecommunication. The connection can be a direct connection, an indirect connection through an intermedium, can be an internal communication between two elements or an interaction between the two elements. For a person of ordinary skill in the art, the specific meaning of the above terminology in the present invention can be understood on a case-by-case basis.

With reference to FIG. 1, embodiment of the present invention provides a display device, and the display device 100 comprises a light emission backplate 10, a color conversion layer 20, and a color film layer 30.

Specifically, the light emission backplate 10 comprises a thin film transistor array substrate and a light emission functional layer. The thin film transistor array substrate comprises a plurality of thin film transistors arranged in an array, and each of the thin film transistors comprises an active layer 103, a gate electrode 105, a source electrode 106, a drain electrode 107. The thin film transistor array substrate further comprises an underlay 101, a buffer layer 102, a gate electrode insulation layer 104, an interlayer dielectric layer 108, and a planarization layer 109. The underlay 101 comprises one of a glass underlay and a flexible underlay. The buffer layer 102 is disposed on the underlay 101, and material of the buffer layer 103 comprises at least one of silicon nitride ($SiN_x$), silicon oxide ($SiO_x$) and silicon oxynitride ($SiO_xN_y$). The active layer 103 is disposed on the buffer layer 102. The active layer 103 comprises a low temperature polysilicon active layer and an oxide active layer. As an optional embodiment, the active layer 103 in the embodiment of the present invention is an indium gallium zinc oxide (IGZO) active layer. The gate electrode insulation layer 104 is disposed on the active layer 103, the gate electrode 105 is disposed on the gate electrode insulation layer 104, the interlayer dielectric layer 108, and the gate electrode 105. The source electrode 106 and the drain electrode 107 are electrically connected to the active layer 103 through a via hole. The planarization layer 109 covers the interlayer dielectric layer 108, the source electrode 106, and the drain electrode 107.

The light emission functional layer comprises an anode layer 110, a pixel definition layer 111, a light emitting layer 112, and a cathode layer 113. The anode layer 110 is electrically connected to the drain electrode 107 through a via hole. The pixel definition layer 111 is disposed on the anode layer 110, and the pixel definition layer 110 comprises an opening, and the light emitting layer 112 is limited in the opening of the pixel definition layer 111. The cathode layer 113 is disposed on the light emitting layer. It should be explained that light emission backplate 10 comprises but is not limited to a light emission backplate of blue light. Because the white light has a wavelength of blue light wave band, the light emission backplate 10 of embodiment of the present invention is the light emission backplate which can still emit white light.

Figure 2:
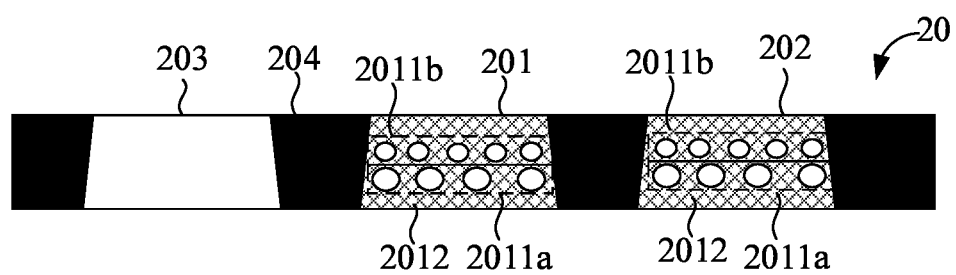
FIG. 2 is a schematic view of a color conversion layer of the display device provided by the embodiment of the present invention.

With reference to FIGS. 1 and 2, FIG. 2 is an enlarged view of the color conversion layer 20 in FIG. 1. The color conversion layer 20 is disposed on the light emission backplate 10, and the color conversion layer 20 comprises a red light conversion unit 201, a green light conversion unit 202, and an opening unit 203. The red light conversion unit 201 and/or green light conversion unit 202 comprises calcium titanate light emitting material 2012 and scattering particles stacked in the calcium titanate light emitting material 2012. A refractive index of the scattering particles gradually increases along a vertical direction pointing from a surface of the color conversion layer 20 near the light emission backplate 10 to a surface of the color conversion layer 20 away from the light emission backplate 10. In the embodiment of the present invention, scattering particles at least comprise first scattering particles 2011a and second scattering particles 2011b, and a refractive index of the first scattering particles 2011a is less than a refractive index of the second scattering particles 2011b. The first scattering particles 2011a is disposed on a surface of the red light conversion unit 201 and/or green light conversion unit 202 near the light emission backplate 10, and the second scattering particles 2011b is disposed on a surface of the red light conversion unit 201 and/or green light conversion unit 202 away from the light emission backplate 10. Furthermore, the red light conversion unit 201 and the green light conversion unit 202 by coatings of mixing the calcium titanate light emitting material 2012 with the scattering particles of different refractive indexes respectively. Namely, mixtures of the calcium titanate light emitting material 2012 respectively including the first scattering particles 2011a and the second scattering particles 2011b are coated sequentially such that the red conversion unit 201 and/or green light conversion unit 202 having the scattering particles of a gradually increasing refractive index is formed along a vertical direction pointing from a surface of the color conversion layer 20 near the light emission backplate 10 to a surface of the color conversion layer 20 away from the light emission backplate 10. In the embodiment of the present invention, the second scattering particles 2011b are disposed at least partially on the first scattering particles 2011a. Alternatively, second scattering particles 2011b are staggered from the first scattering particles 2011a. A ratio of a refractive index n2 of the second scattering particles to a refractive index n1 of the first scattering A particles is from greater than 1 to 2. Preferably, the ratio of the refractive index n2 of a second scattering particles to the refractive index n1 of the first scattering particles is from greater than 1 to 1.5. The opening unit 203 is configured to transmit light emitted out from the light emission backplate 10.

Furthermore, the first scattering particles 2011a comprise inorganic scattering particles and organic scattering particles. The second scattering particles 2011b comprise inorganic scattering particles and organic scattering particles. The inorganic scattering particles comprise at least one of titanium dioxide ($TiO_2$), zirconium dioxide ($ZrO_2$), vanadium dioxide ($VO_2$), tin dioxide ($SnO_2$), aluminum oxide ($Al_2O_3$), and barium titanate ($BaTiO_3$). The organic scattering particles comprise at least one of silastic, polystyrene (PS), and polycarbonate (PC). Moreover, a cross-sectional width of each of the inorganic scattering particles and a cross-sectional width of each of the organic scattering particles are from 10 nanometers to 1200 nanometers, and the cross-sectional width of each of the inorganic scattering particles is less than the cross-sectional width of each of the organic scattering particles. For example, the cross-sectional width of each of the inorganic scattering particles is one of 10 nanometers, 20 nanometers, 50 nanometers, 80 nanometers, 100 nanometers, 200 nanometers, or 300 nanometers. The cross-sectional width of each of the organic scattering particles is one of 10 nanometers, 100 nanometers, 200 nanometers, 300 nanometers, 400 nanometers, 500 nanometers, 600 nanometers, 700 nanometers, 800 nanometers, 900 nanometers, 1000 nanometers, 1100 nanometers, or 1200 nanometers.

Figure 3:
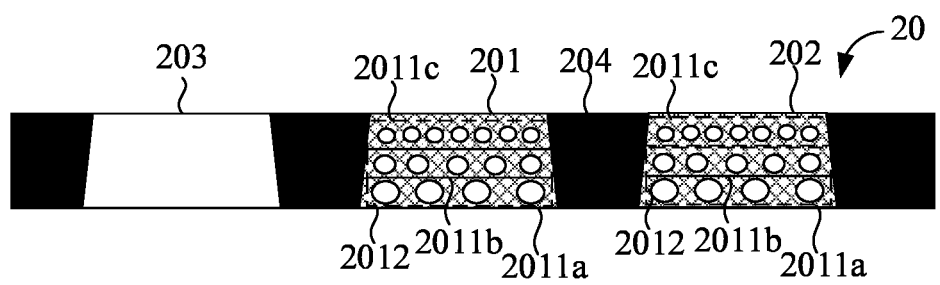
FIG. 3 is another schematic view of a color conversion layer of the display device provided by the embodiment of the present invention.

Optionally, with reference to FIGS. 1 and 3, the scattering particles of embodiment of the present invention also comprise third scattering particles 2011c. The third scattering particles 2011c are disposed on a surface of the red light conversion unit 201 and/or green light conversion unit 202 away from light emission backplate 10, and a refractive index n3 of the third scattering particles is greater than the refractive index n2 of the second scattering particles. A ratio of the refractive index n3 of the third scattering greater than particles to the refractive index n2 of the second scattering particles is from greater than 1 to 2. Preferably, the ratio of the refractive index n3 of the third scattering particles 2011c to the refractive index n2 of the second scattering particles 2011b is from greater than 1 to 1.5. With reference to FIG. 3, in the embodiment of the present invention, each of the red light conversion unit 201 and the green light conversion unit 202 comprises calcium titanate light emitting material 2012 and first scattering particles 2011a, second scattering particles 2011b, and third scattering particles 2011c that are stacked in the calcium titanate light emitting material 2012. The first scattering particles 2011a are organic scattering particles, the second scattering particles 2011b are organic scattering particles/inorganic scattering particles, and the third scattering particles 2011c are inorganic scattering particles. Furthermore, a cross-sectional width of each of the first scattering particles 2011a is greater than a cross-sectional width of each of the second scattering particles 2011b, the cross-sectional width of each of the second scattering particles 2011b is greater than a cross-sectional width of each of the third scattering particles 2011c. In the embodiment of the present invention, third scattering particles 2011c are disposed at least partially on the second scattering particles 2011b. Alternatively, third scattering particles 2011c are staggered from the second scattering particles 2011b. The third scattering particles 2011c comprises at least one of titanium dioxide, zirconium dioxide, vanadium dioxide, tin dioxide, aluminum oxide, and barium titanate.

Furthermore, the red light conversion unit 201 and the green light conversion unit 202 are formed by coatings of mixing calcium titanate light emitting material with the scattering particles of different refractive indexes respectively. Namely, mixtures of the calcium titanate light emitting material respectively including the first scattering particles 2011a, the second scattering particles 2011b, and the third scattering particles 2011c are coated sequentially such that the red conversion unit 201 and/or green light conversion unit 202 having the scattering particles of a gradually increasing refractive index is formed along a vertical direction pointing from a surface of the color conversion layer 20 near the light emission backplate 10 to a surface of the color conversion layer 20 away from the light emission backplate 10. The embodiment of the present invention disposes the first scattering particles 2011a with the low refractive index on the surface of the red light conversion unit 201 and/or green light conversion unit 202 near the light emission backplate 10 such that the surface of the red light conversion unit 201 and/or green light conversion unit 202 near the light emission backplate 10 converges, enhances, and drives light emitted from the light emission backplate 10 to radiate forward. The first scattering particles 2011a improves excitation to the calcium titanate light emitting material. Disposing the second scattering particles 2011b and/or third scattering particles 2011c with the high refractive index on the surface of the red light conversion unit 201 and/or green light conversion unit 202 away from light emission backplate 10 improves a light emission efficiency of the surface of the red light conversion unit 201 and/or green light conversion unit 202 away from the light emission backplate 10, which ultimately enhances performance of the display device 100.

It should be explained that the embodiment of the present invention can further comprise fourth scattering particles, fifth scattering particles and $N^{th}$ scattering particles. Namely, the scattering particles are stacked on one another. Furthermore, along the vertical direction of pointing from a surface of the color conversion layer 20 near the light emission backplate 10 to a surface of the away from the light emission backplate 10, a refractive index of the scattering particles gradually increases.

The calcium titanate light emitting material of the embodiment of the present invention comprises calcium titanate light emitting material with an emission wavelength of red light and calcium titanate light emitting material with an emission wavelength of green light. The calcium titanate light emitting material comprises three-dimensional calcium titanate light emitting material and calcium titanate quantum dot light emitting material. Furthermore, calcium titanate light emitting material comprises inorganic calcium titanate light emitting material and organic-inorganic hybridization calcium titanate light emitting material. The inorganic calcium titanate light emitting material comprises $CsPbI_3$. The organic-inorganic hybridization calcium titanate light emitting material comprises calcium titanate light emitting material with a chemical formula of $CsPbCl_yBrzI_{3-y-z}$, wherein $0<y<1$, $1 \leq z \leq 3-y$, and/or calcium titanate light emitting material with a chemical formula of $CsPbBr_xI_{3-x}$, wherein $2 \leq x \leq 3$.

With reference to FIG. 2 or 3, the color conversion layer 20 further comprises a first black matrix 204 disposed among the red conversion unit 201, the green light conversion unit 202, and the opening unit 203. The first black matrix 204 is configured to isolate adjacent conversion units to prevent color mixture of the color conversion layer 20 lowering the display purity of the display device.

With further reference to FIG. 1, the color film layer 30 of the embodiment of the present invention is disposed on the color conversion layer 20, and the color film layer 30 comprises a red color resist block 302, a blue color resist block 301, and a green color resist block 303 arranged at intervals. The red color resist block 302, the green color resist block 303, and the blue color resist block 301 are disposed correspondingly on the red light conversion unit 201, the green light conversion unit 202, and the opening unit 203 respectively. The color film layer 30 further comprises a second black matrix 304 disposed among the red color resist block 302, the blue color resist block 301, and the green color resist block 30. The second black matrix 304 is configured to isolate adjacent color resist blocks from each other to prevent color mixture of the color film layer reducing a display purity of the display device. In one aspect, light emitted from the light emission backplate 10, after passing through the color conversion layer 20, cannot be fully converted into green light or red light. Therefore, the color film layer 30 of the embodiment of the present invention can filter light passing through the color conversion layer 20 to improve a display purity of the display device 100. In another aspect, color film layer 30 can weaken excitation of external ambient light excitation to the color conversion layer 20 to improve contrast of the display device 100.

With reference to FIGS. 1 and 4, embodiment of the present invention further provides a display device manufacturing method, and the display panel device manufacturing method comprises steps S1 to S3 as follows.

The step S1 comprises forming a light emission backplate 10;

With reference to FIG. 1, the light emission backplate 10 comprises a thin film transistor array substrate and a light emission functional layer. The thin film transistor array substrate comprises a plurality of thin film transistors arranged in an array, and each of the thin film transistors comprises an active layer 103, a gate electrode 105, a source electrode 106, a drain electrode 107. thin film transistor array substrate further comprises an underlay 101, a buffer layer 102, a gate electrode insulation layer 104, an interlayer dielectric layer 108, and a planarization layer 109. The underlay 101 comprises one of a glass underlay and a flexible underlay. The buffer layer 102 is disposed on the underlay 101, and material of the buffer layer 103 comprises at least one of silicon nitride ($SiN_x$), silicon oxide ($SiO_x$), and silicon oxynitride ($SiO_xN_y$). The active layer 103 is disposed on the buffer layer 102, and the active layer 103 comprises a low temperature polysilicon active layer and an oxide active layer. The gate electrode insulation layer 104 is disposed on the active layer 103, the gate electrode 105 is disposed on the gate electrode insulation layer 104, the interlayer dielectric layer 108, and the gate electrode 105. The source electrode 106 and the drain electrode 107 are electrically connected to the active layer 103 through a via hole. The planarization layer 109 covers the interlayer dielectric layer 108, the source electrode 106, and the drain electrode 107.

The light emission functional layer comprises an anode layer 110, a pixel definition layer 111, a light emitting layer 112, and a cathode layer 113. The anode layer 110 is electrically connected to the drain electrode 107 through a via hole. The pixel definition layer 111 is disposed on the anode layer 110. The pixel definition layer 110 comprises an opening, and the light emitting layer 112 is limited in the opening of the pixel definition layer 111. The cathode layer 113 is disposed on the light emitting layer. It should be explained that light emission backplate 10 comprises but is not limited to a light emission backplate of blue light.

Because the white light has a wavelength of blue light wave band, the light emission backplate 10 of embodiment of the present invention is the light emission backplate which can still emit white light.

The step S2 comprises forming a color conversion layer 20 on the light emission backplate 10. The color conversion layer 20 is disposed on the light emission backplate 10, and the color conversion layer 20 comprises a red light conversion unit 201, a green light conversion unit 202 and an opening unit 203. The red light conversion unit 201 and/or the green light conversion unit 202 comprises calcium titanate light emitting material and scattering particles stacked on the calcium titanate light emitting material. a refractive index of the scattering particles gradually increases along a vertical direction pointing from a surface of the color conversion layer 20 near the light emission backplate 10 to a surface of the color conversion layer 20 away from the light emission backplate 10.

The step S3 comprises forming a color film layer 30 on the color conversion layer 20. The color film layer 30 is disposed on the color conversion layer 20, and the color film layer 30 comprises a red color resist block 302, a blue color resist block 301, and a green color resist block 303 that are arranged at intervals. The red color resist block 302, the green color resist block 303, the blue color resist block 301 are disposed correspondingly on the red light conversion unit 201, the green light conversion unit 202, and the opening unit 203 respectively.

Figure 5:
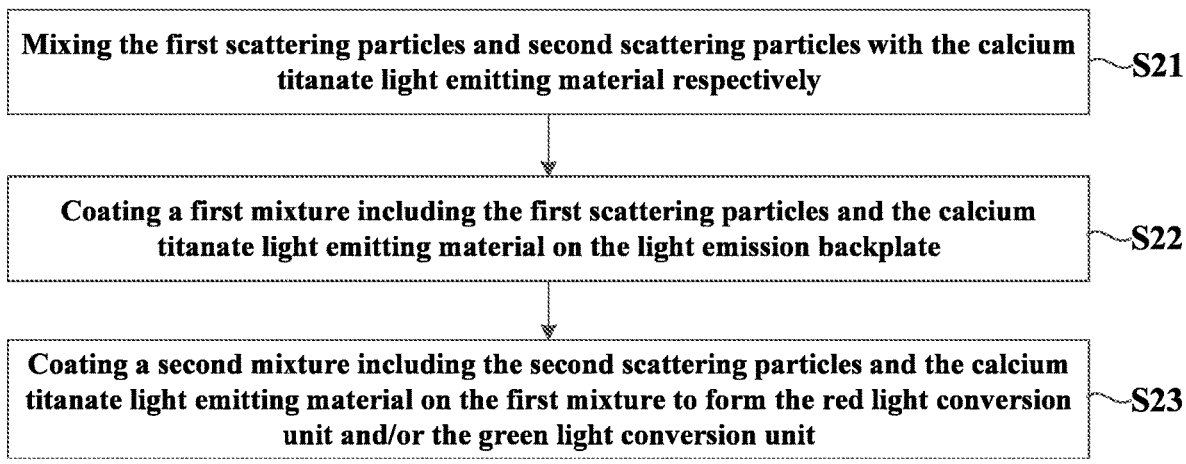
FIG. 5 is a flow chart of a step S2 of the display device provided by the embodiment of an manufacturing method of the present invention.

With reference to FIG. 2, in the step S2, the scattering particles at least comprise first scattering particles 2011a and second scattering particles 2011b, and a refractive index of the first scattering particles 20011a is less than a refractive index of the second scattering particles 2011b. Specifically, with reference to FIG. 5, the step S2 comprises steps S21 to S23.

The step S21 comprises mixing the first scattering particles 2011a and second scattering particles 2011b with the calcium titanate light emitting material respectively;

The step S22 comprises
coating a first mixture including the first scattering particles 2011a and the calcium titanate light emitting material on the light emission backplate 10;

The step S23 comprises
coating a second mixture including the second scattering particles 2011b and the calcium titanate light emitting material on the first mixture to form the red light conversion unit 201 and/or the green light conversion unit 202.

Optionally, with reference to FIG. 3, the scattering particles further comprise third scattering particles 2011c, the third scattering particles 2011c are disposed on a surface of the red light conversion unit 201 and/or green light conversion unit 202 away from the light emission backplate 10, and a refractive index of the third scattering particles is greater than the refractive index of the second scattering particles.

After the step S23, a method further comprises: coating a third mixture including the third scattering particles and the calcium titanate light emitting material on the second mixture to form the red light conversion unit 201 and/or the green light conversion unit 202.

In the display device and the display device manufacturing method provided by embodiment of the present invention, employs the calcium titanate light emitting material as the material of the color conversion layer, and disposes scattering particles with the low refractive index on the surface of the red light conversion unit and/or green light conversion unit near the light emission backplate such that the surface of the red light conversion unit and/or green light conversion unit near the light emission backplate converges, enhances, and drives light emitted from the light emission backplate to radiate forward. The first scattering particles improves excitation to the calcium titanate light emitting material. Disposing the scattering particles with the high refractive index on the surface of the red light conversion unit and/or green light conversion unit away from the light emission backplate, improves a light emission efficiency of f the surface of the red light conversion unit and/or green light conversion unit away from the light emission backplate, which mitigates low light conversion efficiency of the color conversion layer of the display device.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display device, comprising:
    a light emission backplate;
    a color conversion layer disposed on the light emission backplate, the color conversion layer comprising a red light conversion unit, a green light conversion unit, and an opening unit, wherein the red light conversion unit and/or the green light conversion unit comprises calcium titanate light emitting material and scattering particles stacked and disposed in the calcium titanate light emitting material, a refractive index of the scattering particles gradually increases along a vertical direction pointing from a surface of the color conversion layer near the light emission backplate to a surface of the color conversion layer away from the light emission backplate; and
    a color film layer disposed on the color conversion layer, and the color film layer comprising a red color resist block, a blue color resist block, and a green color resist block arranged at intervals, wherein the red color resist block, the green color resist block, and the blue color resist block are disposed correspondingly on the red light conversion unit respectively, the green light conversion unit, and the opening unit respectively.

2. The display device as claimed in claim 1, wherein the scattering particles at least comprise first scattering particles and second scattering particles, and a refractive index of the first scattering particles is less than a refractive index of the second scattering particles, wherein the first scattering particles are disposed on a surface of the red light conversion unit and/or the green light conversion unit near the light emission backplate, and the second scattering particles are disposed on a surface of the red light conversion unit and/or the green light conversion unit away from the light emission backplate.

3. The display device as claimed in claim 2, wherein a ratio of the refractive index of the second scattering particles to the refractive index of the first scattering particles is from greater than 1 to 2.

4. The display device as claimed in claim 2, wherein a cross-sectional width of each of the first scattering particles is greater than a cross-sectional width of each of the second scattering particles.

5. The display device as claimed in claim 2, wherein the second scattering particles are disposed at least partially on the first scattering particles; or, the second scattering particles are staggered from the first scattering particles.

6. The display device as claimed in claim 2, wherein the first scattering particles comprise inorganic scattering particles and organic scattering particles, the second scattering particles comprise inorganic scattering particles and organic scattering particles.

7. The display device as claimed in claim 6, wherein the inorganic scattering particles comprise at least one of titanium dioxide, zirconium dioxide, vanadium dioxide, tin dioxide, aluminum oxide, or barium titanate, the organic scattering particles comprise at least one of silastic, polystyrene, or polycarbonate.

8. The display device as claimed in claim 6, wherein a cross-sectional width of each of the inorganic scattering particles and a cross-sectional width of each of the organic scattering particles are from 10 nanometers to 1200 nanometers, and the cross-sectional width of each of the inorganic scattering particles is less than the cross-sectional width of each of the organic scattering particles.

9. The display device as claimed in claim 2, wherein the scattering particles further comprise third scattering particles, the third scattering particles are disposed on the surface of the red light conversion unit and/or the green light conversion unit away from the light emission backplate, and a refractive index of the third scattering particles is greater than the refractive index of the second scattering particles.

10. The display device as claimed in claim 9, wherein a ratio of the refractive index of the third scattering particles to the refractive index of the second scattering particles is from greater than 1 to 2.

11. The display device as claimed in claim 10, wherein the third scattering particles comprise inorganic scattering particles.

12. The display device as claimed in claim 11, wherein a cross-sectional width of each of the third scattering particles is less than a cross-sectional width of each of the second scattering particles.

13. The display device as claimed in claim 1, wherein the red light conversion unit and the green light conversion unit are formed by coatings of mixing the calcium titanate light emitting material with the scattering particles of different refractive indexes respectively.

14. The display device as claimed in claim 1, wherein the calcium titanate light emitting material comprises calcium titanate light emitting material with an emission wavelength of red light and calcium titanate light emitting material with an emission wavelength of green light.

15. The display device as claimed in claim 14, wherein the calcium titanate light emitting material comprise inorganic calcium titanate light emitting material and inorganic-organic hybridization calcium titanate light emitting material.

16. The display device as claimed in claim 15, wherein the inorganic calcium titanate light emitting material comprises $CsPbI_3$, the organic-inorganic hybridization calcium titanate light emitting material comprises calcium titanate light emitting material with a chemical formula of $CsPbCl_yBr_zI_{3-y-z}$, wherein $0<y<1$, $1\leq z\leq 3-y$, and/or and comprises calcium titanate light emitting material with a chemical formula of $CsPbBr_xI_{3-x}$, wherein $2\leq x\leq 3$.

17. The display device as claimed in claim 14, wherein the calcium titanate light emitting material comprises three-dimensional calcium titanate light emitting material and calcium titanate quantum dot material.

18. A display device manufacturing method, comprising steps as follows:
  a step A: forming a light emission backplate;
  a step B: forming a color conversion layer on the light emission backplate, wherein the color conversion layer is disposed on the light emission backplate, the color conversion layer comprises a red light conversion unit, a green light conversion unit, and an opening unit, the red light conversion unit and/or the green light conversion unit comprises calcium titanate light emitting material and scattering particles stacked and disposed in the calcium titanate light emitting material, a refractive index of the scattering particles gradually increases along a vertical direction pointing from a surface of the color conversion layer near the light emission backplate to a surface of the color conversion layer away from the light emission backplate; and
  a step C: forming a color film layer on the color conversion layer, wherein the color film layer is disposed on the color conversion layer, the color film layer comprises a red color resist block, a blue color resist block, and a green color resist block arranged at intervals, wherein the red color resist block, the green color resist block, and the blue color resist block are disposed correspondingly on the red light conversion unit respectively, the green light conversion unit, and the opening unit respectively.

19. The display device manufacturing method as claimed in claim 18, wherein the scattering particles at least comprise first scattering particles and second scattering particles, and a refractive index of the first scattering particles is less than a refractive index of the second scattering particles, the step B comprises:
  mixing the first scattering particles and second scattering particles with the calcium titanate light emitting material respectively;
  coating a first mixture including the first scattering particles and the calcium titanate light emitting material on the light emission backplate; and
  coating a second mixture including the second scattering particles and the calcium titanate light emitting material on the first mixture to form the red light conversion unit and/or the green light conversion unit.

20. The display device manufacturing method as claimed in claim 19, wherein the scattering particles further comprise third scattering particles, after the step of coating the second mixture including the second scattering particles and the calcium titanate light emitting material on the first mixture, the method further comprises:
  coating a third mixture including the third scattering particles and the calcium titanate light emitting material on the second mixture.

* * * * *